(12) United States Patent
Yoshida et al.

(10) Patent No.: US 6,527,858 B1
(45) Date of Patent: Mar. 4, 2003

(54) P-TYPE ZNO SINGLE CRYSTAL AND METHOD FOR PRODUCING THE SAME

(75) Inventors: Hiroshi Yoshida, Kawanishi (JP); Tetsuya Yamamoto, Kochi (JP)

(73) Assignee: Rohm Co. Ltd. (JP)

( * ) Notice: Subject to any disclaimer, the term of this patent is extended or adjusted under 35 U.S.C. 154(b) by 0 days.

(21) Appl. No.: 09/806,373

(22) PCT Filed: Oct. 8, 1999

(86) PCT No.: PCT/JP99/05581

§ 371 (c)(1),
(2), (4) Date: May 7, 2001

(87) PCT Pub. No.: WO00/22202

PCT Pub. Date: Apr. 20, 2000

(30) Foreign Application Priority Data

Oct. 9, 1998 (JP) .......................................... 10-287966

(51) Int. Cl.[7] .......................... C30B 23/02; B32B 15/04
(52) U.S. Cl. ........................ 117/108; 428/642; 428/658
(58) Field of Search ................. 428/642, 701; 117/103, 92, 108, 944

(56) References Cited

U.S. PATENT DOCUMENTS

| | | | |
|---|---|---|---|
| 4,612,411 A | * 9/1986 | Wieting et al. | 136/265 |
| 5,324,365 A | * 6/1994 | Niwa | 136/256 |
| 5,420,043 A | * 5/1995 | Niwa | 437/4 |
| 5,578,501 A | * 11/1996 | Niwa | 437/2 |
| 5,579,258 A | * 11/1996 | Adachi | 365/145 |
| 5,891,243 A | 4/1999 | Yoshida | |
| 6,291,085 B1 | * 9/2001 | White et al. | 428/642 |
| 6,342,313 B1 | * 1/2002 | White et al. | 428/701 |
| 6,379,521 B1 | * 4/2002 | Nishio | 205/98 |
| 6,410,162 B1 | * 6/2002 | White et al. | 428/642 |

FOREIGN PATENT DOCUMENTS

| | | |
|---|---|---|
| EP | 0 823 498 A1 | 2/1998 |
| JP | 10-53497 | 2/1998 |

OTHER PUBLICATIONS

K. Minegishi et al., "rowgh of p–type Sinc Oxide Films by Chemical Vapor Deposition," Japanese Journal of Applied Physics, vol. 36, part 2, No. 11A, Nov. 1, 1997, pp L 1453–1455.

T. Yamamoto et al., "Solution Using a Codoping Method to Untipolarity for the Fabrication of p–Type ZnO," Jpn. J. Appl. Phys. Vo.. 38 (1999) pp. L 166–169.

* cited by examiner

Primary Examiner—Benjamin L. Utech
Assistant Examiner—Matthew Anderson
(74) Attorney, Agent, or Firm—Pennie & Edmonds LLP

(57) ABSTRACT

A p-type ZnO single crystal having a low resistance; and a method for producing the same providing a substrate (2) in a vacuum chamber (1), supplying to the substrate (2) atomic gases of Zn, O, and N (p-type dopant) and Ga (n-type dopant) in a manner wherein the feeds of N and Ga are controlled in such a manner that the ratio of N:Ga in a crystal is 2:1, and thereby growing a p-type ZnO single crystal containing N and Ga.

14 Claims, 2 Drawing Sheets

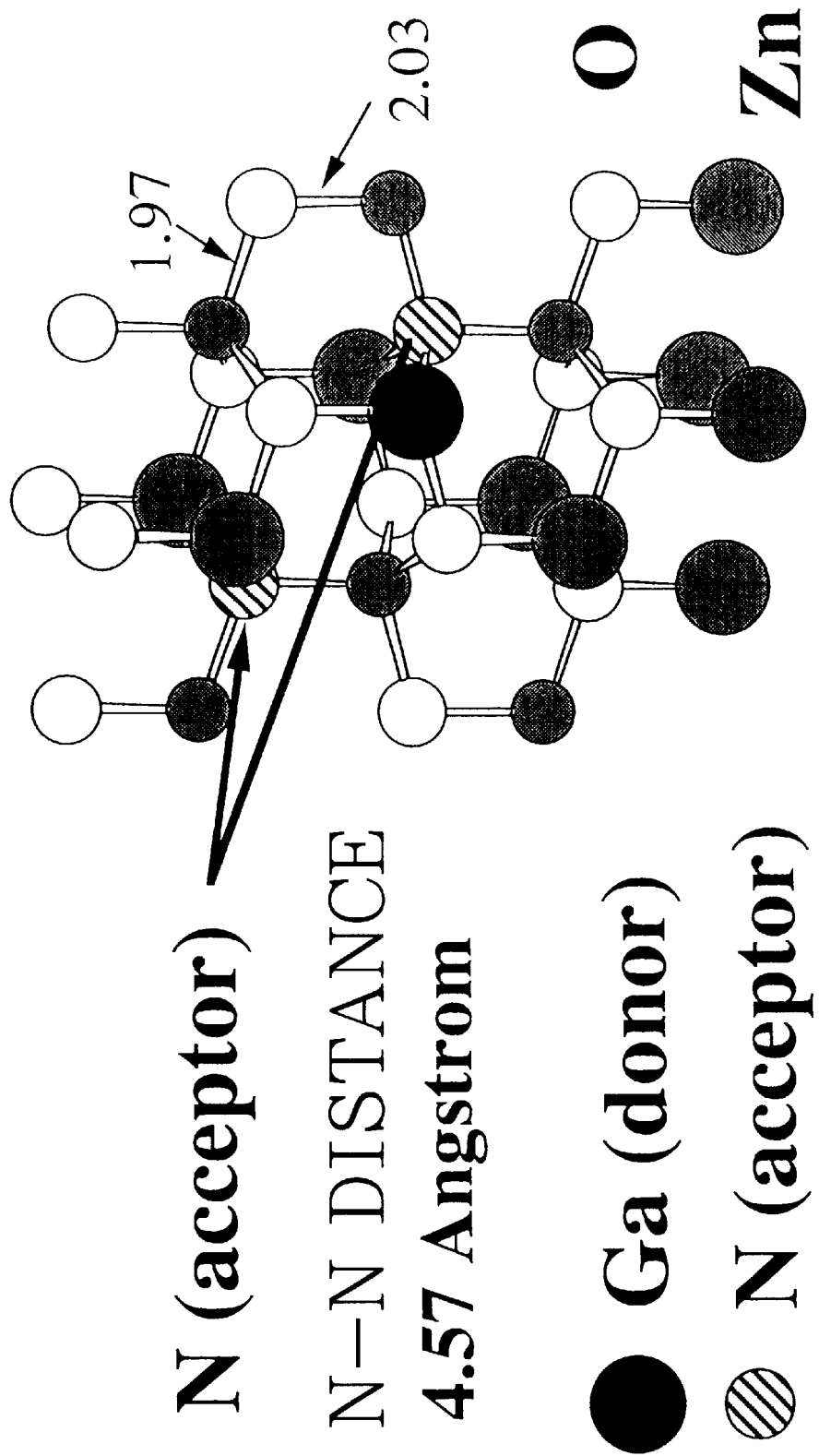

P-TYPE ZNO SINGLE CRYSTAL AND METHOD FOR PRODUCING THE SAME

TECHNICAL FIELD

The present invention relates to a p-type ZnO single crystal that has a resistivity lower than 100Ω·cm, and a method for producing the same.

BACKGROUND ART

Heretofore, as to single crystal thin films of ZnO (zinc oxide) doped with an impurity, although low-resistance single crystal thin films (for example, of a resistivity lower than 100 Ω·cm) have been obtained, as n-type ZnO single crystals, only high-resistance single crystal thin films (for example, of a resistivity of 100Ω·cm or higher) have been obtained as p-type ZnO single crystals.

If a p-type ZnO single crystal thin film having a low resistance could be synthesized, semiconductor devices having a low resistance would be manufactured as injection-type light-emitting diodes, semiconductor lasers, or solar cells by combining with an n-type ZnO single crystal thin film having a low resistance. For example, a semiconductor laser diode that can oscillate in an ultraviolet region, which is required for high-concentration recording or for transmitting a large quantity of information, can be manufactured with ZnO.

Low-resistance n-type ZnO single crystals have been produced easily by doping B (boron), Al (aluminum), Ga (gallium), or In (indium). However, as to p-type ZnO single crystals, only those of high-resistance have been reported.

As to p-type ZnO single thin film, for example, Kasuga et al. of the Engineering Department of Yamanashi University reported at the 59th Meeting of the Applied Physics Society of Japan (Speech No. 17p-YM-8, Japanese Journal of Applied Physics, Part 2 (1 Nov. 1997) Vol. 36, No. 11A, p. 1453). This p-type ZnO single thin film was obtained by doping N (nitrogen). The resistivity of the obtained p-type ZnO thin film is as high as 100Ω·cm, and is not suitable for practical use. Also, this p-type ZnO single thin film has problems such as that the electric conductivity inverses from p-type to n-type after annealing. Furthermore, the reproducibility of the experiment is poor.

Japanese Patent Laid-Open No. 10-53497 discloses a method for producing a p-type ZnSe (zinc serenide) single crystal having a low resistance. ZnSe is a II–VI compound semiconductor like ZnO. In this method, In (indium), an n-type dopant, is doped together with N to increase the solubility of N in ZnSe to $10^{18}$ cm$^{-3}$ or more. However, a p-type ZnO single crystal having a low resistance cannot be obtained even if the same method is applied to ZnO. The reason is as follows:

Firstly, although both ZnSe and ZnO are II-VI compounds semiconductors, these have different crystal structures. ZnSe has a sphalerite structure, while ZnO has a wurtzite structure. Accordingly, the doping characteristics of p-type dopants are different. The solubility of N in ZnSe. is more than $10^{18}$ cm$^{-3}$, while the solubility of N in ZnO is less than $10^{17}$ cm$^{-3}$.

Also, it is reported (by T. Onodera, Associated Professor of Hokkaido University, H. Tabata, Associated Professor of Osaka University, et al.) that, while the solubility of Li (lithium) in ZnSe is low and Li is unstable in ZnSe crystals, the solubility of Li in ZnO is nearly 10%. However, only insulators have been obtained using p-type ZnO single crystals containing Li as the p-type dopant.

Secondly, due to difference in sizes between Se and O, the stabilities of ZnSe crystals and ZnO crystals are different, when these crystals are doped together with N, a p-type dopant, and In, an n-type dopant. In case of ZnSe, the radius of Se atoms to be substituted is larger than the radius of N atoms. In case of ZnO, the radius of O atoms to be substituted is almost the same as the radius of N atoms. Also, the radius of In atoms is about 15% larger than the radius of Zn atoms to be substituted.

Consequently, when ZnSe is doped with both N and In, since In atoms which are larger than Zn atoms enter in the places of Zn atoms (substitute for Zn atoms), and N atoms which are smaller than Se atoms enter the places of Se atoms (substitute for Se atoms), the crystal lattice of ZnSe is stabilized.

On the contrary, when ZnO is doped with both N and In, since N atoms which have almost the same size as O atoms enter in the places of O atoms (substitute for O atoms), the surroundings of In atoms, which are larger than Zn atoms and enter the places of Zn atoms (have substituted for Zn atoms), expands and results a significant strain of the crystal lattice of ZnO. Accordingly, to reduce the energy increase due to strain, oxygen is released to reduce the concentration. The area from which oxygen is released is called an "oxygen vacancy". This phenomenon degrades crystallinity.

Consequently, since the order of element configuration at lattice points is disturbed, even if carriers are formed, these carriers are scattered in the crystal by dopants and oxygen vacancies. As a result, even if ZnO is doped with both N and In, the electric resistance of this p-type ZnO is high. In addition, since oxygen vacancies are vacancies of anionic elements, the formation of oxygen vacancies induces an electron-excess state, which may cause inversion to n-type.

As described above, ZnO requires the doping technology different from that for ZnSe, and the development of a novel doping method for incorporating p-type dopants into ZnO and stabilizing the incorporated p-type dopants has been demanded.

The object of the present invention is to provide a p-type ZnO single crystal having a low resistance, for example, a resistivity lower than 100Ω·cm.

DISCLOSURE OF THE INVENTION

The present invention provides a p-type ZnO single crystal comprising a single crystal of zinc oxide (ZnO) that contains a p-type dopant composed of nitrogen (N), and an n-type dopant composed of any one or more selected from a group consisting of boron (B), aluminum (Al), gallium (Ga), and hydrogen (H).

This p-type ZnO single crystal is produced by doping a single crystal of ZnO with a p-type dopant composed of nitrogen (N), and an n-type dopant composed of any one or more selected from a group consisting of boron (B), aluminum (Al), gallium (Ga), and hydrogen (H), in such a manner that the concentration of the p-type dopant is higher than the concentration of the n-type dopant.

The mechanism of obtaining a p-type ZnO single crystal having a low resistance using this doping technology will be described below.

ZnO is a compound in which O, a hard base (electron-pair donor), and Zn, a medium (not hard but not soft) acid (electron-pair acceptor) are combined. In the present invention, therefore, N, an element acting as a hard base (hard basic element) was selected as the p-type dopant which substitutes for O, a hard base. Also, as the n-type dopant that was added together with N, elements acting as hard acids (hard acidic elements), i.e., B, Al, Ga, and H, were selected.

A hard basic element means a small element that has a large electronegativity and is difficult to polarize. A hard acidic element is an element that has electron cloud not easily polarized and includes small cations having a high electric charge. As known as the HSAB Principle (Principle of Hard and Soft Acids and Bases), a hard basic element causes a chemical reaction with a hard acidic element to form a stable compound easily.

In the present invention, by doping ZnO with a hard basic element (p-type dopant) together with a hard acidic element (n-type dopant) in accordance with this HSAB principle, a chemical reaction occurs between the p-type dopant and the n-type dopant, and both dopants become easily incorporated in the ZnO crystal. And, the both dopants incorporated in the ZnO crystal become chemically stable in the ZnO crystal. Furthermore, since the radii of B, Al, Ga, and H atoms are almost the same or smaller than the radius of a Zn atom, the above-described oxygen vacancies become difficult to be produced, thus the effect of stabilizing the crystal lattice can be obtained.

Although S (sulfur), Se (selenium), and Te (tellurium) are included in VI B group elements other than O (oxygen), all of these are soft basic elements. Therefore, in the method disclosed by Japanese Patent Laid-Open No. 10-53497, N, which is a hard basic element, is selected as the p-type dopant to substitute for Se, which is a soft base. In this method, N is selected as the p-type dopant for the reason that the solubility of N is relatively high on doping as a single dopant. That is, the selection of N in this method is not the selection in accordance with the HSAB principle as in the present invention.

As described above, if both a donor (n-type dopant) and an acceptor (p-type dopant) are present in a crystal in a chemically stable state, the donor and the acceptor will position close to each other, and an interaction occurs between them. By this interaction, a bonding level and an anti-bonding level are formed within the bandgap. That is, within the band gap the energy level of the donor moves toward the conduction band, and the energy level of the acceptor moves toward the valence band. As a result, since the acceptor level and the donor level become shallow compared with doping with a p-type dopant alone, the number of carriers excited by heat increases.

Also, when ZnO is doped with a p-type dopant alone, the scattering or restriction of carriers by the dopant occurs within the range of 100 angstrom or more around the dopant. However, when ZnO is doped with a p-type dopant together with an n-type dopant, since the donor having the opposite charge from the acceptor is present in the vicinity of the acceptor, the range where the effect of the dopant reaches decreases to several ten angstrom or less. As a result, since the average free path of the carriers increases the resistance decreases significantly. That is, ZnO can be doped stably to a high concentration of the p-type dopant stably.

The present invention also provides a p-type ZnO single crystal comprising a single crystal of zinc oxide (ZnO) which contains a p-type dopant composed of carbon (C), and an n-type dopant composed of any one or more selected from a group consisting of boron (B), aluminum (Al), gallium (Ga), and hydrogen (H).

This p-type ZnO single crystal is produced by doping a single crystal of ZnO with a p-type dopant composed of carbon (C) and an n-type dopant composed of any one or more selected from a group consisting of boron (B), aluminum (Al), gallium (Ga), and hydrogen (H), in such a manner that the concentration of p-type dopant is higher than the concentration of n-type dopant. In the method for producing this p-type ZnO single crystal, it is preferable to supply zinc (Zn) excessively compared with oxygen (O).

The mechanism of obtaining a p-type ZnO single crystal having a low resistance using this doping technology will be described below.

Since C is the only basic element in IV B group elements, and substitutes for O, another basic element, C can be a p-type dopant for ZnO. However, C is a medium (not hard but not soft) basic element. When ZnO is doped with B, Al, Ga, or H, which are hard basic elements, as an n-type dopant together with such a C, since the chemical bonding of these elements with C is unstable, Zn is easily released. And a phenomenon occurs that C enters the vacancy produced after the Zn has been released. That is, C is in the state of easily substituting for Zn, a medium acid. This substitution means that C functions as an n-type dopant.

Thereby, the crystallinity of ZnO doped with C together with B, Al, Ga, or H becomes unstable, and in the crystal, a phenomenon occurs in which C that functions as an n-type dopant offsets C that functions as a p-type dopant.

Therefore, in the case of producing a p-type ZnO single crystal by this doping technology, it is preferable to supply zinc (Zn) excessively compared with oxygen (O). The chemical bonding occurs between Zn and C, which are both medium elements, and the substitution of Zn by C is prevented. As a result, since the crystallinity of ZnO doped with C together with B, Al, Ga, or H is stabilized, and C functions only as a p-type dopant in this crystal, the effect (reduction of resistance) obtained by doping with an n-type dopant together with C is enhanced.

The present invention also provides a p-type ZnO single crystal comprising a single crystal of zinc oxide (ZnO) that contains a p-type dopant composed of carbon (C), and an n-type dopant composed of indium (In).

This p-type ZnO single crystal is produced by doping a single crystal of ZnO with a p-type dopant composed of carbon (C), and an n-type dopant composed of indium (In), in such a manner that the concentration of the p-type dopant is higher than the concentration of the n-type dopant. In the method for producing this p-type ZnO single crystal, it is preferable to supply zinc (Zn) excessively compared with oxygen (O).

The mechanism of obtaining a p-type ZnO single crystal having a low resistance using this doping technology will be described below.

Since C is the only basic element in IV B group elements, and substitutes for O, another basic element, C can be a p-type dopant for ZnO. However, C is a medium (not hard but not soft) basic element. In the present invention, doping of In, a medium acidic element, as an n-type dopant together with C in accordance with the HSAB principle, a chemical reaction occurs between the p-type dopant and the n-type dopant, and both dopants become easily incorporated in the ZnO crystal.

However, C, which is a medium basic element, easily substitutes not only for O, which is a hard basic element, but also for Zn, which is a medium acidic element. Thus, this substitution with Zn causes poor crystallinity. Therefore, when a p-type ZnO single crystal is produced using this doping technology, it is preferable to supply zinc (Zn) excessively compared with oxygen (O). Thereby, a chemical reaction occurs between Zn and C, which are both medium element, thus preventing the substitution of Zn by C is prevented.

As a result, the crystallinity of ZnO doped with C together with In is stabilized, and the effect (reduction of resistance) obtained by doping an n-type dopant together with C is enhanced.

In the method for producing a p-type Zn single crystal of the present invention, it is preferable to dope with the p-type dopant and the n-type dopant in such a manner that the concentration of the p-type dopant is 1.5 times or more and 5 times or less of the concentration of n-type dopant. It is more preferable that the concentration of the p-type dopant is twice the concentration of the n-type dopant. The reason will be described below.

When four p-type dopants are coordinated in the vicinity of three n-type dopants that are adjacent to each other, the repulsive force between excessive electrons emitted from the n-type dopants makes the crystal lattice unstable causing energy loss to occur. In this case, the concentration of the p-type dopants is about 1.3 times the concentration of the n-type dopants.

However, if the doping is done in such a manner that the concentration of the p-type dopants is 1.5 times the concentration of the n-type dopants or more, three or more p-type dopants are coordinated in the vicinity of two n-type dopants that are adjacent to each other. In this case, since the repulsive force between the n-type dopants is reduced, the crystal lattice is stabilized and energy loss is prevented.

Also, it is not preferable that the number of p-type dopants coordinated in the vicinity of the n-type dopants exceeds five times as many as the number of the n-type dopants, because the Coulomb's repulsive force between the p-type dopants is significantly strengthened, and the p-type dopants may be separated.

As an embodiment of the method for producing a p-type ZnO single crystal of the present invention, there is provided a method wherein zinc (Zn) and oxygen (O), and a p-type dopant and an n-type dopant are simultaneously supplied to grow a single crystal of zinc oxide (ZnO) containing said p-type dopant and said n-type dopant on a semiconductor substrate.

The methods for simultaneously supplying zinc (Zn) and oxygen (O), and a p-type dopant and an n-type dopant include MOCVD (Metal Organic Chemical Vapor Deposition) method, MBE (Molecular Beam Epitaxy) method, and the like. When the MOCVD method is used, the deposition is performed in a sufficient quantity of oxygen plasma.

In the method for producing a p-type ZnO single crystal of the present invention, it is preferable to supply atomic p-type dopants and/or n-type dopants in an atomic state produced by electronic excitation with radio waves, laser beams, X-rays, or electron beams.

In the method for producing a p-type ZnO single crystal of the present invention, although doping with p-type dopants and doping with n-type dopants may be performed simultaneously, or may be performed in different times, it is preferable to do simultaneously.

The method for producing a p-type ZnO single crystal of the present invention preferably comprises the steps of growing a single crystal of zinc oxide (ZnO) containing a p-type dopant and an n-type dopant on a semiconductor substrate, cooling the grown single crystal, and heat-treating the single crystal at a high temperature while an electric field being applied. By these steps, hydrogen naturally incorporated into the crystal from moisture in the air or the like can be passivated and removed out of the crystal.

BRIEF DESCRIPTION OF THE DRAWINGS

FIG. 2 is a diagram showing the crystal structure of a ZnO crystal doped with a p-type dopant N and an n-type dopant Ga in a ratio of N:Ga=2:1. This crystal structure was determined using a method of "ab initio" electric band structure calculations.

Figure 1:
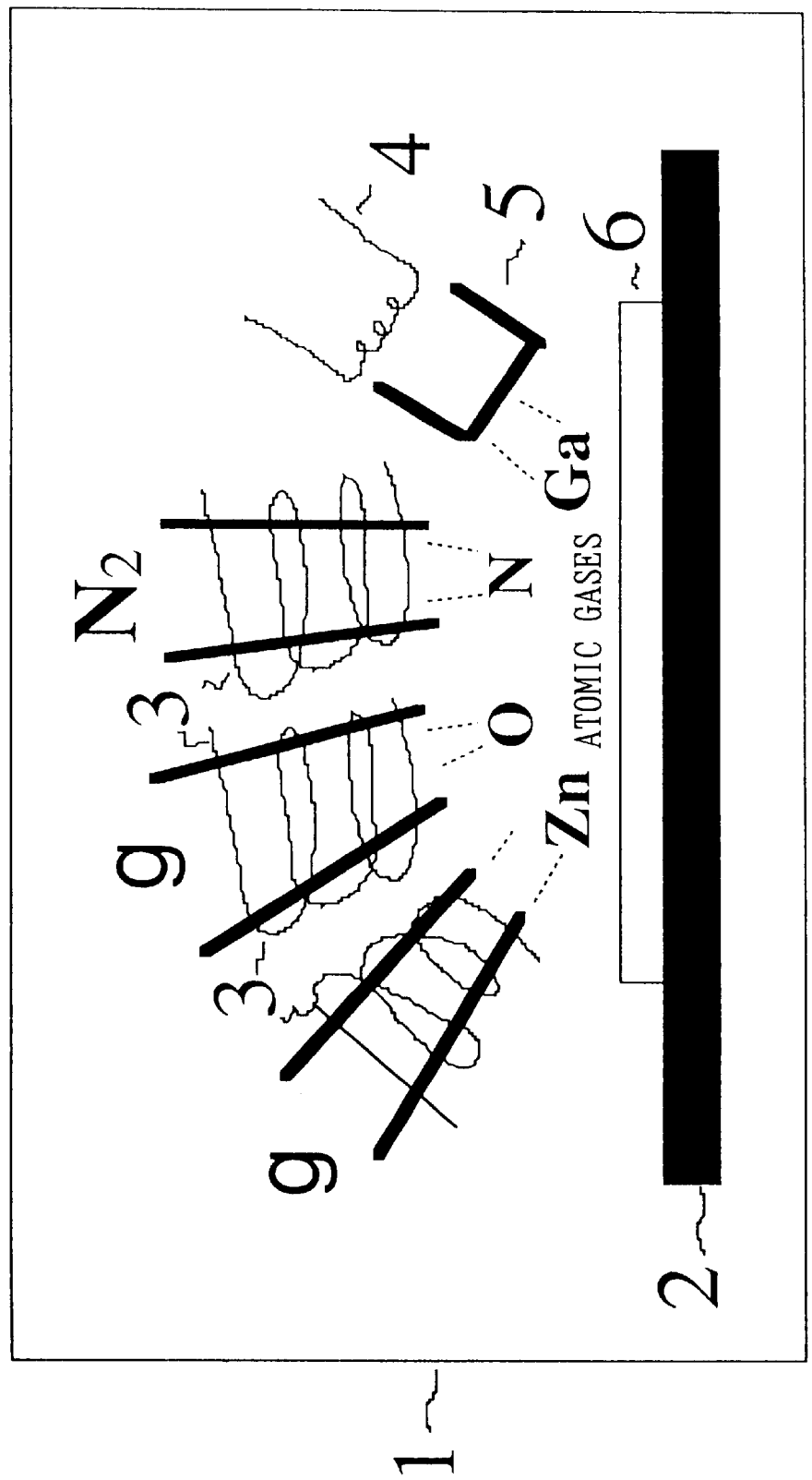
FIG. 1 is a schematic constitutional diagram showing the inside of a vacuum chamber used for forming a thin film of a p-type ZnO single crystal on a substrate using the MBE method.

Best Mode of Carrying Out the Invention

The embodiments of the present invention will be described below for forming a thin film of a p-type ZnO single crystal on a substrate using the molecular-beam epitaxial growth method (MBE method).

Embodiment 1

A ZnO single crystal containing N and Ga was grown on a semiconductor substrate by simultaneously supplying Zn, O, N (p-type dopant) and Ga (n-type dopant) using the MBE method. FIG. 1 is a schematic structural diagram showing the inside of a vacuum chamber 1 used for the growth of the ZnO single crystal. The vacuum in the vacuum chamber 1 is maintained at $10^{-8}$ torr, and a substrate 2 is placed in the vacuum chamber 1. To this substrate 2, atomic gases of Zn, O, N, and Ga are supplied.

The flow rate of Zn was $10^{-6}$ torr, the flow rate of O was $106^{-6}$ torr, the flow rate of Ga was $10^{-7}$ torr, and the flow rate of N was $5`10^{-7}$ torr. These were simultaneously flowed on the substrate 2 to epitaxially grow a p-type ZnO single crystal at each temperature between 350° C. and 650° C. Here, the ratio of quantities of supplied Zn and O was 1:1. The ratio of supplied N and Ga was adjusted to N:Ga=5:1, so that the existing ratio in the crystal became N:Ga=2:1.

As Zn, a solid material having a purity of 99.99999% that had been atomized by heating with a heater was used. As O, atomic oxygen having a purity of 99.9999% that had been activated by a RF radical cell was used. As N to become the acceptor, nitrogen radicals generated by an RF (13.56 MHZ) excitation-type radical beam source were used. As Ga to become the donor, atomic gallium produced by radiating electromagnetic waves in a microwave range to the molecular gas, or by heating the single cell to a high temperature, was used. In FIG. 1, reference numeral 3 indicates an RF (high frequency) coil, 4 indicates a heater, and 5 indicates a single cell (gallium source).

Also, a ZnO single crystal containing N was grown on a semiconductor substrate by simultaneously supplying Zn, O, and N (p-type dopants) using the MBE method. The crystal growing conditions in this case were the same as the above conditions except that the flow rate of Ga was 0.

The hole concentration, the Hall mobility, and the resistivity of each p-type ZnO thin film obtained as described above were measured. Resistivity was measured using the four-probes method. The results are shown in Table 1. In Table 1, the "Ga, N" column shows the results as to the thin films doped with both Ga and N, and the "N" column shows the results as to the thin films doped with N alone.

The following facts can be identified from Table 1: The higher the crystal growing temperature (substrate temperature), the higher the hole concentration. When the thin film was doped with both Ga and N, the hole concentration at each crystal growing temperature was more than two digits higher than the hole concentration when the thin film was doped with N alone. By doping with both N and Ga, the thin film having a hole concentration of $1.0 \times 10^{17}$ (holes/cm$^3$) or more could be obtained. Also the Hall mobility when the thin film was doped with both Ga and N was several times larger than the Hall mobility when the thin film was doped with N alone.

Since resistivity is inversely proportional to the product of hole concentration and Hall mobility, the value of resistivity when the thin film was doped with both N and Ga, was more than two digits smaller than the value when the thin film was doped with N alone. By doping with both N and Ga, the thin film having a resistivity of lower than 100Ω·cm could be obtained. Also, by doping with both N and Ga, a thin film of a p-type ZnO single crystal having a hole concentration as high as $1.033 \times 10^{17}/cm^3$, and resistivity as low as 10Ω·cm could be obtained even at the crystal growing temperature as low as 350° C.

FIG. 2 is a diagram showing a crystal structure of a ZnO crystal doped with a p-type dopant (acceptor) N and an n-type dopant (donor) Ga in a ratio of N:Ga=2:1. This crystal structure was determined using a method of "ab initio" electric band structure calculations.

As seen in FIG. 2, N can be present stably in the ZnO crystal when N, an acceptor, enters the ZnO crystal together with Ga, a donor. As a result, it was confirmed that a more densely doped p-type ZnO single crystal was obtained than when a ZnO crystal was doped with a single dopant. Also when a ZnO crystal was doped with B, Al, or H in place of Ga as an n-type dopant, the similar results as described above could be obtained.

Embodiment 2

A ZnO single crystal containing C and Ga was grown on a semiconductor substrate by simultaneously supplying Zn, O, C (p-type dopant) and Ga (n-type dopant) using the MBE method. Also in this case, a vacuum chamber 1 of the same type as shown in FIG. 1 was used, and a p-type ZnO single crystal was epitaxially grown at each temperature between 350° C. and 650° C. in the same manner as in Embodiment 1 except that C was used in place of N.

Also, a ZnO single crystal containing N was grown on a semiconductor substrate by simultaneously supplying Zn, O, C (p-type dopant) using the MBE method. The crystal growing conditions in this case were the same as the above conditions except that the flow rate of Ga was 0.

Embodiment 3

A ZnO single crystal containing C and Ga was grown on a semiconductor substrate by simultaneously supplying Zn, O, C (p-type dopant) and Ga (n-type dopant) using the MBE method. Also in this case, a vacuum chamber 1 of the same type as shown in FIG. 1 was used, and a p-type ZnO single crystal was epitaxially grown at each temperature between 350° C. and 650° C. in the same manner as in Embodiment 1 except that C was used in place of N, and Zn was excessively supplied compared with O (supply ratio, Zn:O= 3–4:1).

The hole concentration, the Hall mobility, and the resistivity of each p-type ZnO thin film of Embodiments 2 and 3 obtained as described above were measured. Resistivity was measured using the four-probes method. The results of measurements are shown in Table 2. In Table 2, the "Ga, C" column shows the results of the thin films doped with both C and Ga, and the "C" column shows the results of the thin films doped with C alone. Also, the upper portion of the "Ga, C" column shows the results of Embodiment 2 where the quantities of supplied Zn and O were the same. The lower portion of the "Ga, C" column shows the results of Embodiment 3 where Zn was excessively supplied compared with O.

The following facts can be identified from Table 2: When ZnO was doped with both C and Ga, the hole concentration at each growing temperature was more than two digits higher than the hole concentration when ZnO was doped with C alone. The Hall mobility when ZnO was doped with both C and Ga was 10 to 20 times larger than the Hall mobility when ZnO was doped with C alone. The resistivity of ZnO doped with both C and Ga was about three digits smaller than the resistivity of ZnO doped with C alone.

Also, a thin film of a p-type ZnO single crystal having a low resistance, i.e., a resistivity of lower than 100Ω·cm can be obtained by doping both C and Ga, even if the crystal growing temperature is as low as 350° C. Furthermore, by supplying Zn excessively compared with O, a thin film of a p-type ZnO single crystal having a lower resistivity with higher hole concentration can be obtained in comparison with the case where the same quantity of Zn and O are supplied.

The similar results can be obtained when ZnO is doped with B, Al, or H in place of Ga as an n-type dopant.

Embodiment 4

A ZnO single crystal containing C and In was grown on a semiconductor substrate by simultaneously supplying Zn, O, and C (p-type dopant) and In (n-type dopant) using the MBE method. Also in this case, a vacuum chamber 1 of the same type as shown in FIG. 1 was used, and a p-type ZnO single crystal was epitaxially grown at each temperature between 350° C. and 650° C. in the same manner as in Embodiment 1 except that C was used in place of N, and In was used in place of Ga.

Also, a ZnO single crystal containing C was grown on a semiconductor substrate by simultaneously supplying Zn, O, and C (p-type dopant) using the MBE method. The crystal growing conditions in this case were the same as the above conditions except that the flow rate of In was 0.

Embodiment 5

A ZnO single crystal containing C and In was grown on a semiconductor substrate by simultaneously supplying Zn, O, and C (p-type dopant) and In (n-type dopant) using the MBE method. Also in this case, a vacuum chamber 1 of the same type as shown in FIG. 1 was used, and a p-type ZnO single crystal was epitaxially grown at each temperature between 350° C. and 650° C. in the same manner as in Embodiment 1 except that C was used in place of N, In was used in place of Ga, and Zn was excessively supplied compared with O (supply ratio, Zn:O=2–4:1).

The hole concentration, the Hall mobility, and the resistivity of each p-type ZnO thin film of Embodiments 4 and 5 obtained as described above were measured. Resistivity was measured using the four-probes method. The results of measurements are shown in Table 3. In Table 3, the "In, C" column shows the results of the thin films doped with both In and C, and the "C" column shows the results of the thin films doped with C alone. Also, the upper portion of the "In, C" column shows the results of Embodiment 4 where the quantities of supplied Zn and O were the same. The lower portion of the "In, C" column shows the results of Embodiment 5 where Zn was excessively supplied compared with O.

The following facts can be identified from Table 3: When ZnO was doped with both C and In, the hole concentration at each growing temperature was more than two digits higher than the hole concentration when ZnO was doped with C alone. The Hall mobility when ZnO was doped with both C and In was 20 and several to 40 times larger than the Hall mobility when ZnO was doped with C alone. The resistivity of ZnO doped with both C and In was about three digits smaller than the resistivity of ZnO doped with C alone.

Also, a thin film of a p-type ZnO single crystal having a low resistance, i.e., a resistivity of lower than 100Ω·cm can be obtained even if the crystal growing temperature is as low as 350° C. by doping both C and In, and Zn is excessively supplied compared with O. Furthermore, by supplying Zn excessively compared with O, a thin film of a p-type ZnO single crystal having a lower resistivity with higher hole concentration can be obtained in comparison with the case where the same quantity of Zn and O are supplied.

Furthermore, when ZnO is doped with a transition metal of magnetic element (Mn, Fe, or Co) as well as a p-type dopant, a magnetic-semiconductor hybrid functional element can be produced.

single crystal thin film, the dimension of the energy gap can be controlled freely. Thereby, high-performance opto-electronic materials over visual to ultraviolet regions, injection-type light-emitting diodes, semiconductor lasers, and the like can be obtained. In particular, a semiconductor laser diode that can oscillate in ultraviolet regions can be manufactured from ZnO.

Furthermore, the p-type ZnO single crystal having a low resistance is useful as a semiconductor having a low resistance for a photo-electric converter device, such as a solar cell.

According to the present invention, a p-type ZnO single crystal of the present invention can be obtained easily.

What is claimed is:

1. A p-type ZnO single crystal comprising a single crystal of zinc oxide (ZnO) that contains a p-type dopant composed of nitrogen (N), and an n-type dopant composed of any one or more elements selected from a group consisting of boron (B), aluminum (Al), gallium (Ga), and hydrogen (H).

TABLE 1

| Substrate temperature (° C.) | Hole concentration (holes/cm$^3$) | | Hall mobility (cm$^2$/V − s) | | Resistivity (Ω · cm) | |
|---|---|---|---|---|---|---|
| | Ga, N | N | Ga, N | N | Ga, N | N |
| 350 | $1.0 \times 10^{17}$ | $1.0 \times 10^{15}$ | 75 | 10 | 10 | 150 |
| 400 | $4.0 \times 10^{17}$ | $1.5 \times 10^{15}$ | 90 | 14 | 3 | 120 |
| 450 | $8.5 \times 10^{17}$ | $2.8 \times 10^{15}$ | 100 | 25 | 0.5 | 110 |
| 600 | $2.0 \times 10^{18}$ | $1.0 \times 10^{16}$ | 110 | 35 | 0.08 | 100 |

TABLE 2

| Substrate temperature (° C.) | Hole concentration (holes/cm$^3$) | | Hall mobility (cm$^2$/V − s) | | Resistivity (Ω · cm) | |
|---|---|---|---|---|---|---|
| | Ga, C + Zn excess | C | Ga, C + Zn excess | C | Ga, C + Zn excess | C |
| 350 | $7.5' \times 10^{16}$ $9.8 \times 10^{16}$ | $9.0 \times 10^{13}$ | 8.0 8.2 | 0.4 | 95 65 | 85000 |
| 400 | $1.5' \times 10^{17}$ $3.0' \times 10^{17}$ | $1.2' \times 10^{14}$ | 11 12 | 0.7 | 45 22 | 35000 |
| 450 | $2.5' \times 10^{17}$ $4.5' \times 10^{17}$ | $2.3 \times 10^{14}$ | 21 21 | 1.0 | 8.0 4.5 | 11500 |
| 600 | $1.0' \times 10^{18}$ $2.5' \times 10^{18}$ | $1.0 \times 10^{15}$ | 32 33 | 1.7 | 0.9 0.75 | 950 |

TABLE 3

| Substrate temperature (° C.) | Hole concentration (holes/cm$^3$) | | Hall mobility (cm$^2$/V − s) | | Resistivity (Ω · cm) | |
|---|---|---|---|---|---|---|
| | In, C + Zn excess | C | In, C + Zn excess | C | In, C + Zn excess | C |
| 350 | $4.5 \times 10^{16}$ $7.8 \times 10^{16}$ | $9.0 \times 10^{13}$ | 10.0 10.5 | 0.4 | 110 75 | 85000 |
| 400 | $0.3 \times 10^{17}$ $1.8 \times 10^{17}$ | $1.2 \times 10^{14}$ | 14 13 | 0.7 | 65 33 | 35000 |
| 450 | $0.5 \times 10^{17}$ $1.2 \times 10^{17}$ | $2.3 \times 10^{14}$ | 31 44 | 1.0 | 11 2.5 | 11500 |
| 600 | $0.2 \times 10^{18}$ $1.1 \times 10^{18}$ | $1.0 \times 10^{15}$ | 41 41 | 1.7 | 0.6 0.25 | 950 |

INDUSTRIAL APPLICABILITY

According to the present invention, a p-type ZnO single crystal having a resistivity lower than 100Ω·cm is provided.

When this p-type ZnO single crystal having a low resistance is combined with an already existing n-type ZnO 2. A p-type ZnO single crystal comprising a single crystal of zinc oxide (ZnO) that contains a p-type dopant composed of carbon (C), and an n-type dopant composed of any one or more elements selected from a group consisting of boron (B), aluminum (Al), gallium (Ga), and hydrogen (H).

3. A p-type ZnO single crystal comprising a single crystal of zinc oxide (ZnO) that contains a p-type dopant composed of carbon (C), and an n-type dopant composed of indium (In).

4. The p-type ZnO single crystal according to any one of claims 1 to 3, wherein hole concentration is $1\times10^{17}$ holes/cm$^3$ or more.

5. The p-type ZnO single crystal according to any one of claims 1 to 3, wherein electric resistivity is lower than 100Ω·cm.

6. A method for producing a p-type ZnO single crystal comprising doping a ZnO single crystal with a p-type dopant composed of nitrogen (N) and an n-type dopant composed of any one or more elements selected from a group consisting of boron (B), aluminum (Al), gallium (Ga) and hydrogen (H), in such a manner that the concentration of said p-type dopant is higher than the concentration of said n-type dopant.

7. A method for producing a p-type ZnO single crystal comprising doping a ZnO single crystal with a p-type dopant composed of carbon (C) and an n-type dopant composed of any one or more elements selected from a group consisting of boron (B), aluminum (Al), gallium (Ga), and hydrogen (H), in such a manner that the concentration of said p-type dopant is higher than the concentration of said n-type dopant.

8. A method for producing a p-type ZnO single crystal comprising doping a ZnO single crystal with a p-type dopant composed of carbon (C), and an n-type dopant composed of indium (In), in such a manner that the concentration of said p-type dopant is higher than the concentration of said n-type dopant.

9. The method for producing a p-type ZnO single crystal according to claims 7 or 8, wherein zinc (Zn) is supplied excessively compared with oxygen (O).

10. The method for producing a p-type ZnO single crystal according to any one of claims 6 to 8, wherein said ZnO single crystal is doped with the p-type dopant and the n-type dopant, in such a manner that the concentration of said p-type dopant is 1.5 times or more and 5 times or less the concentration of said n-type dopant.

11. The method for producing a p-type ZnO single crystal according to any one of claims 6 to 8, wherein zinc (Zn) and oxygen (O), and the p-type dopant and the n-type dopant are simultaneously supplied to grow a single crystal of zinc oxide (ZnO) containing said p-type dopant and said n-type dopant on a semiconductor substrate.

12. The method for producing a p-type ZnO single crystal according to claim 11, wherein said p-type dopant and/or said n-type dopant are supplied in an atomic state produced by electronical excitation with radio waves, laser beams, X rays, or electron beams.

13. The method for producing a p-type ZnO single crystal according to claim 11, wherein said single crystal of zinc oxide (ZnO) containing the p-type dopant and the n-type dopant is grown on the semiconductor substrate, and the grown ZnO single crystal is cooled, then heat-treated at a high temperature while applying an electric field.

14. The method for producing a p-type ZnO single crystal according to claim 13, wherein said p-type dopant and/or said n-type dopant are supplied in an atomic state produced by electronical excitation with radio waves, laser beams, X rays, or electron beams.

* * * * *